United States Patent
Culler

(10) Patent No.: US 6,370,678 B1
(45) Date of Patent: Apr. 9, 2002

(54) SYSTEM AND METHOD FOR ADJUSTING LOGIC SYNTHESIS BASED ON POWER SUPPLY CIRCUIT MODELS

(75) Inventor: Jason H Culler, Livermore, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/559,030

(22) Filed: Apr. 27, 2000

(51) Int. Cl.[7] ............................................. G06F 17/50
(52) U.S. Cl. ........................... 716/18; 716/4; 703/18
(58) Field of Search ........................ 716/1, 2, 4, 5, 716/6, 8, 9, 10, 11, 18; 703/13, 14, 18

(56) References Cited

U.S. PATENT DOCUMENTS

| | | | | |
|---|---|---|---|---|
| 5,557,531 A | * | 9/1996 | Rostoker et al. | 364/489 |
| 5,572,436 A | * | 11/1996 | Dangelo et al. | 364/489 |
| 6,151,568 A | * | 11/2000 | Allen et al. | 703/14 |
| 6,311,147 B1 | * | 10/2001 | Tuan et al. | 703/18 |
| 6,321,186 B1 | * | 11/2001 | Takahashi | 703/15 |

* cited by examiner

*Primary Examiner*—Matthew Smith
*Assistant Examiner*—Leigh Marie Garbowski
(74) *Attorney, Agent, or Firm*—Kyle J Way

(57) ABSTRACT

A system and method of adjusting the logic synthesis process of the design of an integrated circuit takes into account the interaction between the IC core logic circuitry, the on-chip power supply circuitry, and the package power supply circuitry. In IC package/circuit technology combinations that have been employed in previous IC designs, the associated package and on-chip power supply circuit designs are stable and well-defined, thus allowing the generating of simulation models for those power supply circuits. Those models are used to identify resonant frequencies and other characteristics of the power supply circuitry. By using the identity of the power supply resonant frequencies and the power supply models themselves, design constraints are developed that are supplied as input, either directly or indirectly, to the logic synthesis process to avoid incompatibilities of a periodic and non-periodic nature between the IC core logic and the power supply circuitry.

24 Claims, 10 Drawing Sheets

PRIOR ART

PRIOR ART

PRIOR ART

SYSTEM AND METHOD FOR ADJUSTING LOGIC SYNTHESIS BASED ON POWER SUPPLY CIRCUIT MODELS

BACKGROUND OF THE INVENTION

One of the most important advances in the area of electronic integrated circuit (IC) design over the past few years has been the development of logic synthesis as part of the overall IC design process. In a nutshell, logic synthesis allows IC designers to more fully utilize the ever-increasing number of transistors available in an IC while ignoring the tedious complexities associated with direct gate-level design. Thus, logic synthesis has allowed the designer to concentrate on the functionality of an IC while, at the same time, reducing its associated time-to-market.

As shown in FIG. 1, logic synthesis currently is a vital part of a typical IC design process 1. An IC designer initially generates a high-level behavioral or register-transfer-level (RTL) description (step 100) of the functionality of a proposed IC, which is normally written in a hardware design language (HDL), with VHDL and Verilog being the two most popular examples. Often, a functional simulation of the behavioral or RTL description is performed thereafter to determine if the circuit logically operates as was intended (step 110). If this simulation (step 110) yields no unpleasant surprises, the designer then uses a set of software tools that performs logic synthesis (step 120) to transform the behavioral or RTL description into a schematic representation of circuit elements, such as logic gates, transistors, resistors, and the like, along with the associated logical connections between elements. The synthesized circuit elements and logical connections are then simulated once again (step 130) at the logic gate level to check the operation of the circuit against previously specified voltage and timing constraints. If the gate-level simulation (step 130) executes successfully, the schematic of circuit elements and connections is then passed to a "place-and-route" tool (step 140), which determines the actual location of the circuit elements and connections within the space available on the IC. A final simulation (step 150) is then performed, this time on the circuit generated by the place-and-route tool, in order to determine if the chip meets all functional and timing constraints, given the actual physical layout of the circuit.

As can be seen in FIG. 1, successful completion of a step of the IC design process brings the IC design one step closer to being a viable IC. Conversely, any problems or failures discovered in any of the steps results in some portion of the design process to be repeated. (FIG. 1 indicates a few of the possible "repeating" paths.) In the past, a reasonable number of failures were expected early on in the process, such as during functional simulation (step 110) or gate-level simulation (step 130), with relatively few problems encountered at final simulation (step 150).

However, with the decreasing size in the IC geometries being used, and the correspondingly higher number of transistors available on an IC, the standard design process described above has proven inadequate at times, with a significant number of IC failures not being discovered until final simulation (step 150). This is especially problematic considering that the manufacturing process for the IC is oftentimes begun prior to final simulation, since that simulation (step 150) is quite a time-consuming task due to the complex nature of the circuit models and current waveforms involved. Unlike before, when logic gate timing delays contributed the overwhelming majority of the overall timing delay of a signal, the latest advances in IC manufacturing technology have caused the connections between logic gates to be the single largest contributor to signal delay in most cases. Since the signal delay in a connection is dependent upon the length of that connection, the placement and routing of the connection must be known with a high degree of certainty in order to accurately model the signal delay involved. Unfortunately, under typical IC design process 1, the place-and-route information is not known until well after the RTL design and synthesis steps have been performed.

Recently, companies such as Synopsis Inc. and Avant! Corporation have devised new IC design tool strategies to deal with this problem. Although the various strategies differ in the details, they basically involve the addition of "quick," or non-final, types of synthesis and place-and-route functions earlier in the design process to determine within certain error limits the lengths of the interconnections in the IC. In FIG. 2, an updated IC design process 2 is shown, with a quick synthesis and place-and-route step (step 200) essentially being added early in the design flow. (Frequently, the "quick" place-and-route function is termed "floorplanning".) As a result, timing simulations at the gate level are carried out using preliminary physical layout information, thereby giving the IC designer greater confidence that the IC will actually perform as expected prior to final place-and-route. In other words, the "logical" design steps of RTL definition and logic synthesis are more tightly coupled with the "physical" design steps of placing and routing under updated IC design process 2. Potential timing problems are thus discovered earlier in the design process, saving development time that would otherwise be wasted during place-and-route (step 140) and final simulation (step 150). Therefore, the problems involved with meeting timing constraints under the older process have been mitigated somewhat with the newer IC design approaches.

However, the latest advances in design methodology do not appear to address all of the problems associated with the typical separation of the logical and physical portions of IC design. For example, some currently available IC design tools allow analysis of the average magnitude of the loads placed on the on-chip power grid during the logical portion of the design cycle to determine power requirements for the various areas of the IC. However, the IC power supply circuitry, which includes both the on-chip power circuitry and the IC package power circuitry, is generally not taken into account during the design of the IC core logic. As a result, incompatibilities between the IC power supply circuitry and the IC core logic circuitry can cause problems not easily identified until final simulation (step 150).

Even if fluctuations of the power supply at the pins of an IC package are insignificant, the power still has a significant amount of circuitry to traverse before it reaches the on-chip logic circuitry of an IC, as can be seen in the diagrammatic representation of FIG. 3. More specifically, package power supply pins 320, typically labeled VDD and GND, are the entry points of the power and ground connections into an IC package 300. Ordinarily, on LSI components, multiple VDD and GND power supply pins 320 are supplied to allow a sufficient amount of current to pass between IC package 300 and a circuit board power supply circuit 310 to operate the chip properly. Power supply pins 320 are, in turn, connected to a package power supply circuit 330, which is made up primarily of, but not limited to, a network of metal planes, grids, and bypass capacitors inside the IC package. Package power supply circuit 330, in turn, provides power to an on-chip power supply circuit 340, which is made up mainly of metal grids and more bypass capacitors. It is on-chip power supply circuit 340 that is attached via multiple connection points to an IC core logic circuit 350, which performs the logical functions expected of the IC. As is well-known in the art, the bypass capacitors in package power supply circuit 330 and on-chip power supply circuit 340 are placed across the power and ground planes and grids to help stabilize the power supply voltage levels by providing charge during short time periods of high current demand by core logic circuit 350.

As can be appreciated by someone of skill in the art, the IC designer pays much attention to the problem of providing adequate and stable power to core logic circuit 350 by investing a significant amount of time and resources into the design of both package power supply circuit 330 and on-chip power supply circuit 340. However, depending on the physical and operational characteristics of core logic circuit 350, problems in the power supplied at the core may still exist, leading to faults in the operation of the logic circuitry. For example, package power supply circuit 330, with its network of planes, grids, and bypass capacitors, usually exhibits a resonant frequency at which the impedance of that circuitry increases substantially. If at least some portion of core logic circuit 350 is operated in a periodic fashion at or near that resonant frequency, package power supply circuit 330 will exhibit the increased impedance, thereby resulting in a reduced power supply voltage at core logic circuit 350 during that time. Such an unstable power supply voltage, in turn, causes the voltage trigger points of core logic circuit 350 to fall, possibly allowing small amounts of noise on a signal line to trigger a logic gate input falsely, thereby causing operational failure of the IC. On-chip or externally provided clock signals are typical determinants of the operational frequency of the clock. However, even clock signals with primary frequencies less than that of the resonant frequency of the IC package may cause problems, since many harmonics are present in such clock signals, especially those clock signals with extremely short rise and falls times. Oppositely, clock signal frequencies greater than the package resonant frequency may also cause failures, as some large portions of core logic circuit 350 may trigger in response to multiple periods of a clock signal, resulting in operational frequencies that are some fraction of that of the original clock signal.

Package power supply circuit 330 is not the only source of power supply impedance. On-chip power supply circuit 340, with its power supply grid and bypass capacitors on the IC chip itself, also contributes to this effect, often generating a more prominent resonance point at a higher frequency than its package counterpart. With two resonance points in the power supply circuit, it can be appreciated by those skilled in the art that the power supply resonances are potential barriers to designing a chip that works correctly for all combinations of temperature, timing, and supply voltage constraints that are specified for the IC.

In addition to the periodic nature of core logic circuit 350, and its interaction with the resonant frequencies of package and on-chip power supply circuits 330 and 340, core logic circuit 350 may also exhibit substantial non-periodic current demands on the power supply circuitry in the form of current "spikes," or short, non-periodic instances of extremely high current demand. These spikes occur, for example, as a result of the response of core logic circuit 350 to a change in state of one of the IC input signal lines driven by circuitry external to IC package 300. Logic signal changes within IC package 300 may also cause current spikes to occur. Spikes of sufficiently large magnitude cause temporary failure in the portion of the power supply circuitry that is in close proximity to the section of core logic circuit 350 responsible for that current demand. Unfortunately, in order to detect such problems prior to final simulation 150, more information concerning the structure of package and on-chip power supply circuits 330 and 340 is required earlier in IC design processes 1 and 2. For example, the nature of the power supply circuitry must be known sufficiently to determine the level of current demand necessary at various locations within core logic circuit 350 to cause a drop in supply voltage that would cause core logic circuit 350 to fail.

Unfortunately, the electrical characteristics of the package and on-chip power supply circuits, including the identity of the power supply circuit resonant frequencies, and their resultant effects on the operation of core logic circuit 350, are currently not known with sufficient accuracy during the logic description (100) and synthesis (120) steps of either of design processes 1 and 2 described above to prevent design problems early in the IC design cycle. Typically, such problems are not found until final simulation, which is rather late in the design process, impacting time-to-market adversely.

Thus, it would be advantageous to utilize information concerning the power supply circuitry of the package and the chip earlier in the IC design cycle to modify the synthesis of the IC core logic. Such modification would help avoid operational faults related to the periodic and non-periodic interaction of the core logic and the power supply circuitry.

SUMMARY OF THE INVENTION

The embodiments of the invention, to be discussed in detail below, allow the use of the package and on-chip chip power supply circuit models and associated resonant frequencies as input to the initial IC RTL description and synthesis process. These additional inputs, when used properly, help prevent the core logic from placing too high a periodic current demand at the resonant frequencies, and too high a non-periodic current spike that exceeds the capabilities of the package and on-chip power supply circuits. Without specific information concerning the electrical characteristics of the power supply circuits, valuable time-to-market is often wasted during the initial description, synthesis, and simulation of the IC in creating a logic core that is incompatible with the power supply circuitry that will be used to drive the chip.

According to an embodiment of the invention, a method of adjusting the core logic of an IC based on the electrical characteristics of the package and on-chip power supply circuits begins with developing electrical models of those power supply circuits. As will be discussed later, on-chip power supply SPICE models for ICs recently have become available prior to initial floorplanning activity. Similarly, package power supply circuitry for a particular package size is also available, with the associated SPICE model. Circuit simulations are then performed on each of these two models in order to determine the primary resonant frequencies identified with each of the power supply circuits. The resonant frequency of the on-chip power supply circuit is then used as input to initial floorplanning, or "first chip route," for the IC. Positional current waveforms, each specific to various locations on the IC core logic, are then developed from an analysis of the initial floorplan. The positional current waveforms are, in turn, used in conjunction with the previously generated power supply circuit models to run power supply integrity simulations. The results of these power supply integrity simulations, along with the two previously identified resonant frequencies, are then used to generate design constraints associated with the power supply circuitry and its interaction with the core logic circuitry. The design constraints are then used to either manually modify the core logic by way of the RTL description language, or to automatically modify the logic synthesis process. Whether the manual or automatic approach is taken, the core logic of the IC is modified according to techniques known in the art so that the primary frequency components of the electrical current demands of the logic are "pushed away" from those resonant frequencies. Also, problematic core logic current waveforms are also "smoothed out" so that the magnitude of current frequencies coinciding with the resonant frequencies, and the magnitude of non-periodic current demands, are reduced to a level that will not cause power supply voltage failures.

In some cases, either the package or on-chip power supply circuit model is not obtained before the RTL description of the core logic circuit has been synthesized. Embodiments of the invention exist which allow the model of either the package or on-chip power supply circuit to be utilized for adjustment of the core logic gate-level description.

Another embodiment of the invention is a system which produces a set of design constraints that mitigate problems associated with the interaction of the package and on-chip power supply circuits and the core logic circuit. One portion of the system is a circuit simulator, which takes the package and on-chip power supply circuit models as input, and determines the primary resonant frequencies for those models. Also included in the system is an initial floorplanner, which takes as input the on-chip power supply resonant frequency and the initial block-level description of the core logic circuit as input, and generates a set of positional current waveforms. A power supply integrity simulator then utilizes the positional waveforms and the power supply circuit models to generate a set of design constraints associated with the power supply circuits. The design constraints, in addition to the identity of the power supply resonant frequencies, are then either used as input to a logic synthesis tool to adjust the synthesis of the core logic circuit, or used manually by an IC designer to adjust the high-level description of the core logic.

Additionally, alternate system embodiments allow the use of either the package or on-chip power supply circuit model alone, thus allowing the absence of one of the power supply circuit models while adjusting the IC core logic using information about the known power supply circuit model.

Other aspects and advantages of the invention will become apparent from the following detailed description, taken in conjunction with the accompanying drawings, illustrating by way of example the principles of the invention.

DETAILED DESCRIPTION

Figure 4:
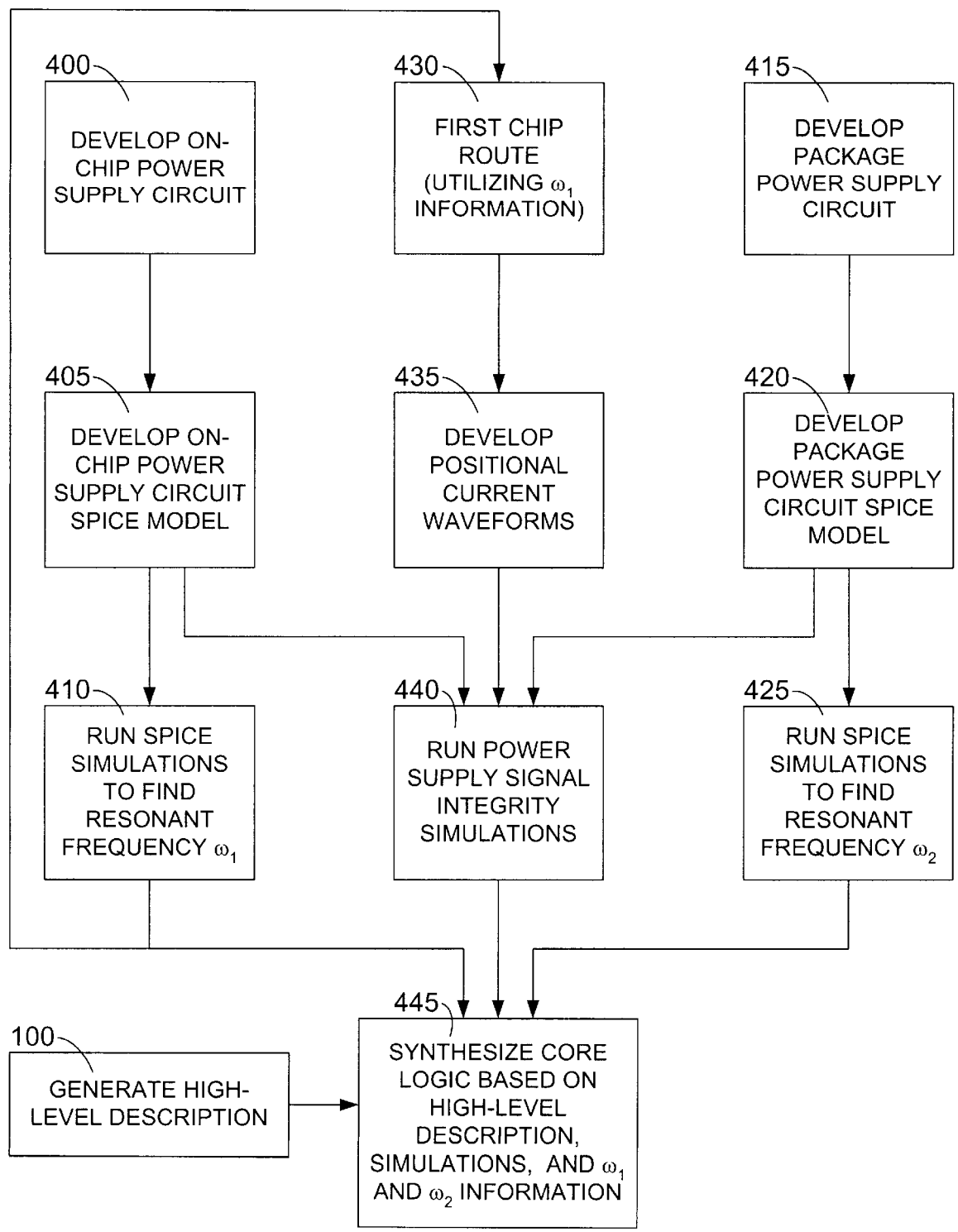
FIG. 4 is a flow chart of a logic synthesis adjustment method according to an embodiment of the invention in which both the package and on-chip power supply circuits are previously known, and the resulting design constraints are input directly into a logic synthesis tool.

An embodiment of a method according to the invention is shown in the block diagram of FIG. 4. The synthesis adjustment process shown in the diagram is started by separately developing both the on-chip power supply circuit (step 400) and the package power supply circuit (step 415). Generally, ICs that utilize the same package size and technology will also utilize very similar on-chip and package power supply circuits. As a result, the designs for those two power supply circuits for a given package/technology combination will tend to be quite stable, having been generated initially by hand, and subsequently modified through many design cycles during the development of other ICs. If the package and associated IC technology for a new IC to be designed have been previously utilized, the designs for the package and on-chip power supplies will already be completed before the design of the core logic begins, allowing knowledge of the power supply circuits to influence the synthesis process of the IC core logic, as seen below.

Once good power supply circuits have been achieved, it becomes advantageous to dedicate resources to generate the complex SPICE models of the on-chip power supply circuit (step 405) and the package power supply circuit (step 420). Once the SPICE models have been generated, simulations are run on the on-chip power supply circuit (step 410) and the package power supply circuit (step 425) to determine resonant frequencies $\omega 1$ and $\omega 2$, respectively, with $\omega 1$ generally being greater than $\omega 2$. The on-chip design libraries used during the IC design process would also use these power supply circuit SPICE models for gate-level and final simulations.

Once on-chip power supply resonant frequency $\omega 1$ has been determined, that information can be used as input to the "first chip route" process (step 430). First chip route, in one embodiment, is an initial type of floorplanning that allows the designer to estimate the space and location to be used for the various functional "blocks" to be implemented within the chip. Generally, this initial floorplanning is accomplished by using as input block-level information about the IC, such as the identity of the functional blocks to be utilized (RAM, ROM, and processor core, for example) and their basic capabilities (processor speed, RAM size and speed, and so on). The use of resonant frequency $\omega 1$ in early floorplanning aids in identifying potential conflicts between $\omega 1$ and parameters of the chip design that may be known at the early floorplanning stage, such as the primary IC clock frequency, and the associated clock driver and repeater scheme. For example, if the primary IC clock frequency is the same as $\omega 1$, the clock frequency may be changed (if allowed by the chip specification) so that the clock frequency and $\omega 1$ do not coincide. Similarly, the chip clock driver and repeater scheme may be modified so that not all drivers and repeaters are triggering at the same instant, thus "smoothing out" the current spikes so that the current demand of the IC at frequency $\omega 1$ is reduced to an acceptable level. The smoothing of the waveform can be accomplished, for example, by modifying the lengths of the traces in the driver and repeater circuit so that the gates involved do not all trigger at precisely the same instant.

Figure 1:
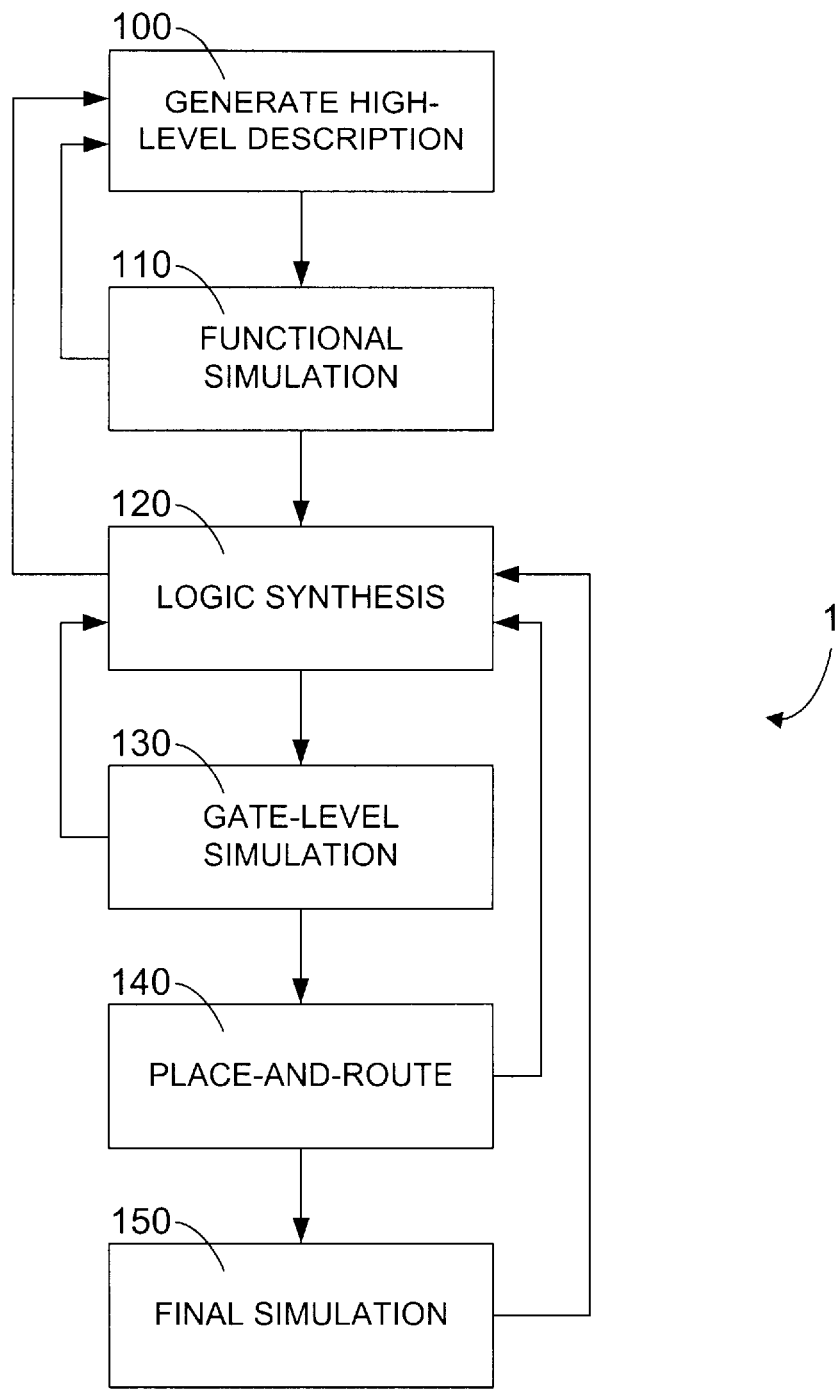
FIG. 1 is a flow chart of a standard IC design process.
Figure 2:
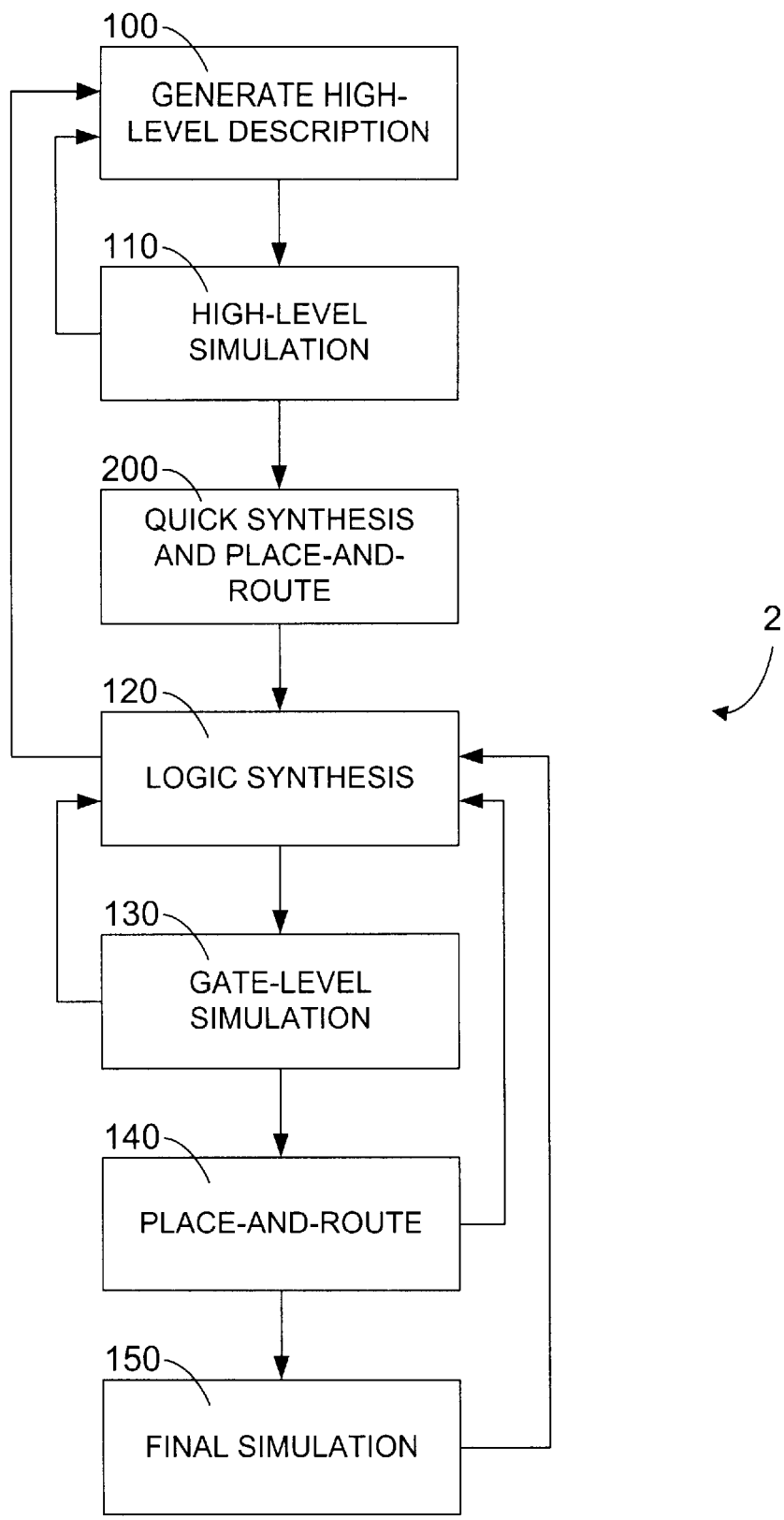
FIG. 2 is a flow chart of an updated IC design process that more closely couples the logical and physical aspects of the process.
Figure 3:
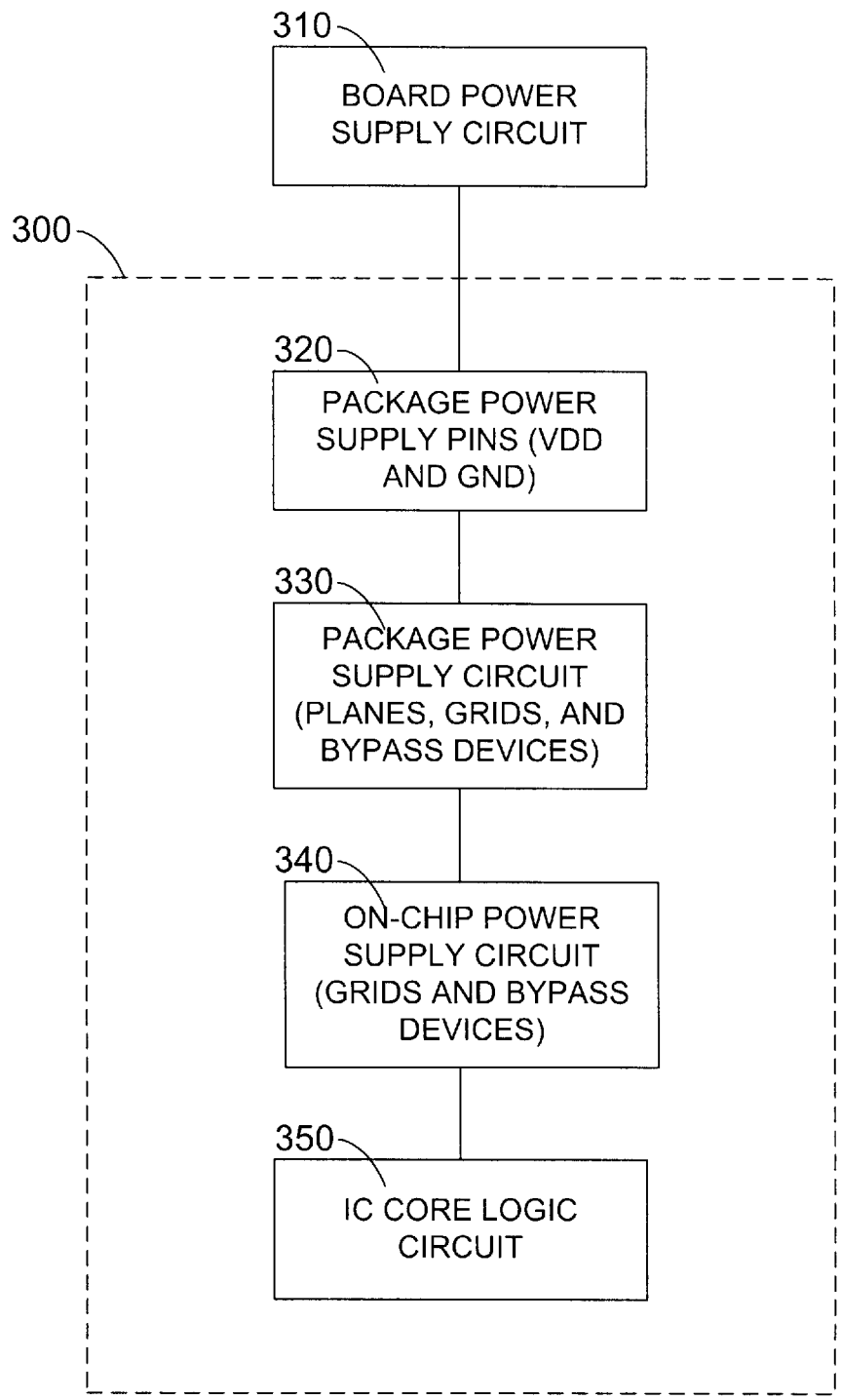
FIG. 3 is a block diagram of the power supply and core logic circuitry of a typical IC.

As a result of the early floorplanning (step 430), simulated positional current waveforms may then be generated (step 435). These waveforms represent the expected amplitude and frequency of the periodic and non-periodic aspects of the electrical current being drawn at numerous locations within the core logic circuitry of the IC under various operating conditions. These positional current waveforms are then used, in turn, to drive both the on-chip and package power supply circuit SPICE models generated earlier in the synthesis adjustment process via a power supply signal integrity simulation (step 440). The results of power supply integrity simulation 440 will indicate if a compatibility problem exists between the core logic circuitry and the on-chip and package power supply circuits. This information is then used as a set of design constraints into a logic synthesis process (step 445) to guide the actual synthesis of the high-level description to the gate level. (The high-level description, in an alternate embodiment, has already been analyzed by functional simulation 110, of FIG. 1, prior to logic synthesis (step 445).) The nature of such constraints is similar to those already used in a typical synthesis process, such as the timing requirements of the logic, the area limitations of the IC, and the overall power limits under which the IC must operate. For example, an area of the core logic circuit may be identified as potentially causing too high a current spike on the power supply during certain input signal states. In another case, a portion of core logic may be operating at a magnitude and frequency that would cause failure of the power supply to sustain the supplied voltage within acceptable limits. The design constraints would thus indicate these potential situations to the logic synthesis tool, indicating that the resulting gate-level description of the core logic must address these issues.

Figure 5:
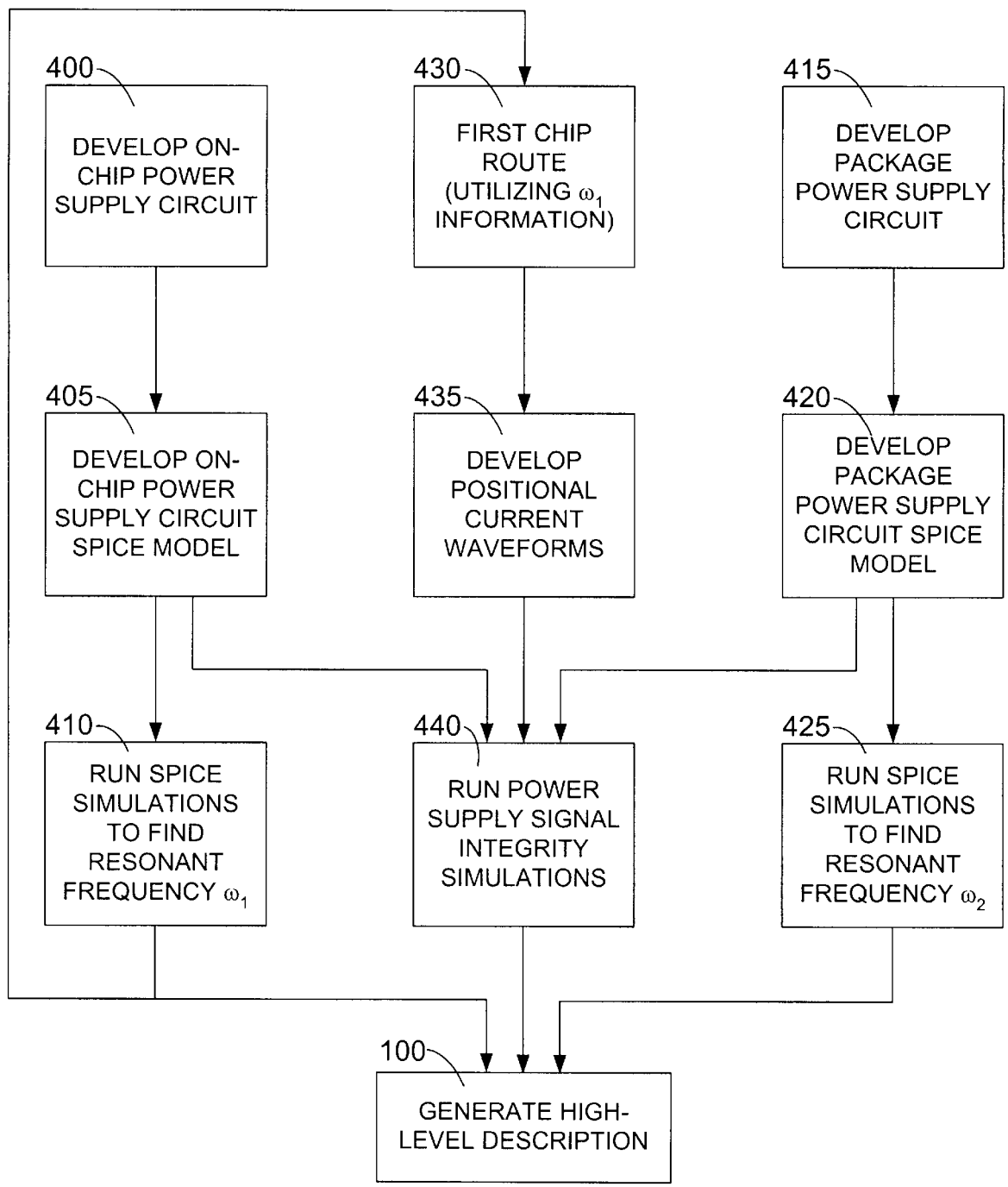
FIG. 5 is a flow chart of a logic synthesis adjustment method according to an embodiment of the invention in which both the package and on-chip power supply circuits are previously known, and the resulting design constraints are used to manually modify the high-level description of the IC.

In an alternate embodiment, shown in FIG. 5, the identity of $\omega 1$ and $\omega 2$ and the results of the power supply signal integrity simulation are used to manually modify the high-level description of the logic to remedy the power supply resonance problems that were identified (step 100). The high-level description is then synthesized as part of a normal IC design process.

Whether the problems are handled manually in the high-level description, or automatically during synthesis, the methods used to mitigate the identified problems are known to those skilled in the art. In addition to the clock circuit modification techniques discussed earlier, other ways of reducing the amount of current drawn by the core logic at a particular instant exist. For example, instead of clocking all portions of a circuit on the same positive or negative edge of a clock signal, it is possible in some circuits to use a mix of positive- and negative-edge clocking to spread out the current demands more evenly throughout the cycle period.

Figure 6:
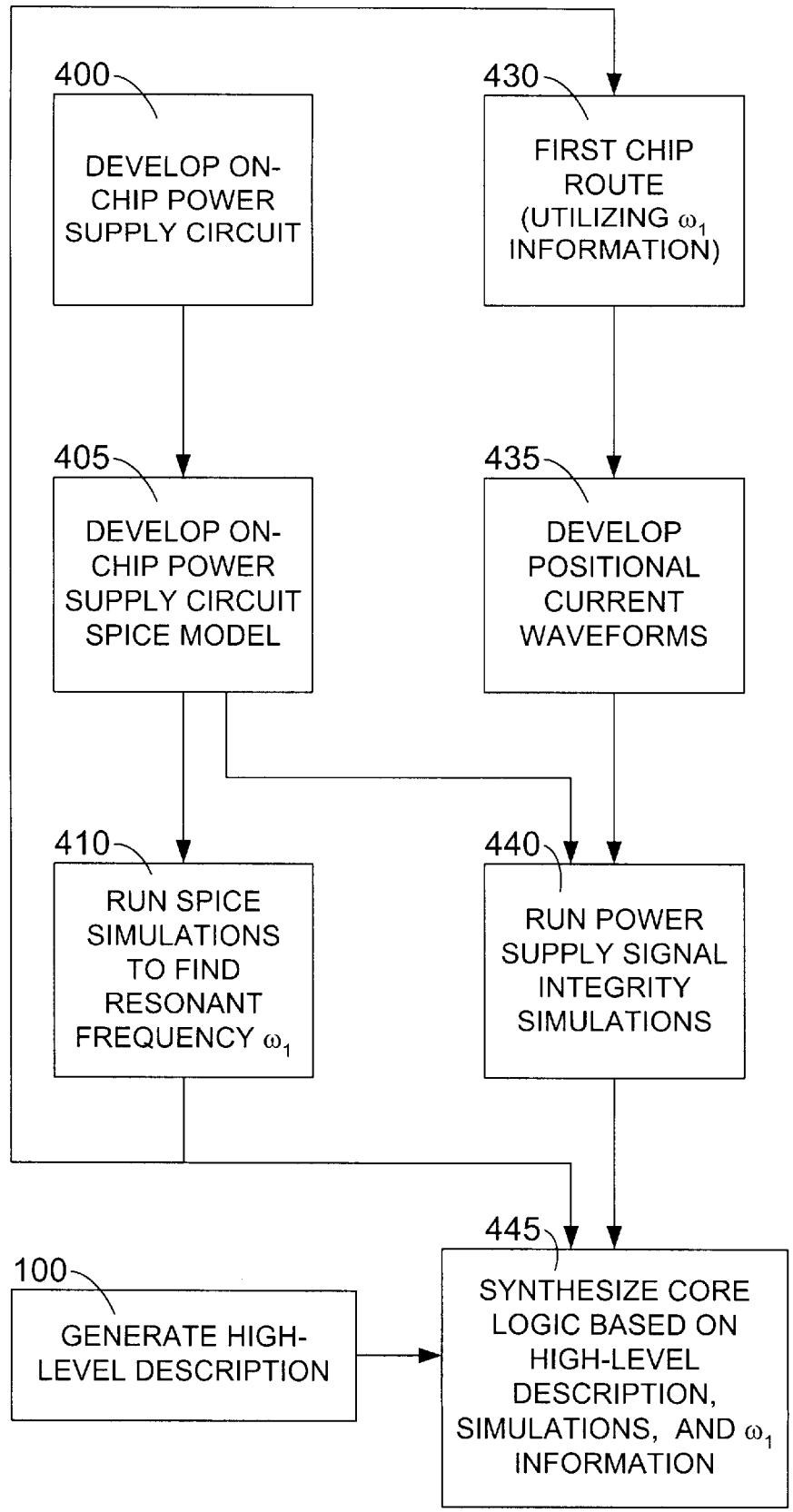
FIG. 6 is a flow chart of a logic synthesis adjustment method according to an embodiment of the invention in which only the on-chip power supply circuit is previously known, and the resulting design constraints are input directly into a logic synthesis tool.
Figure 7:
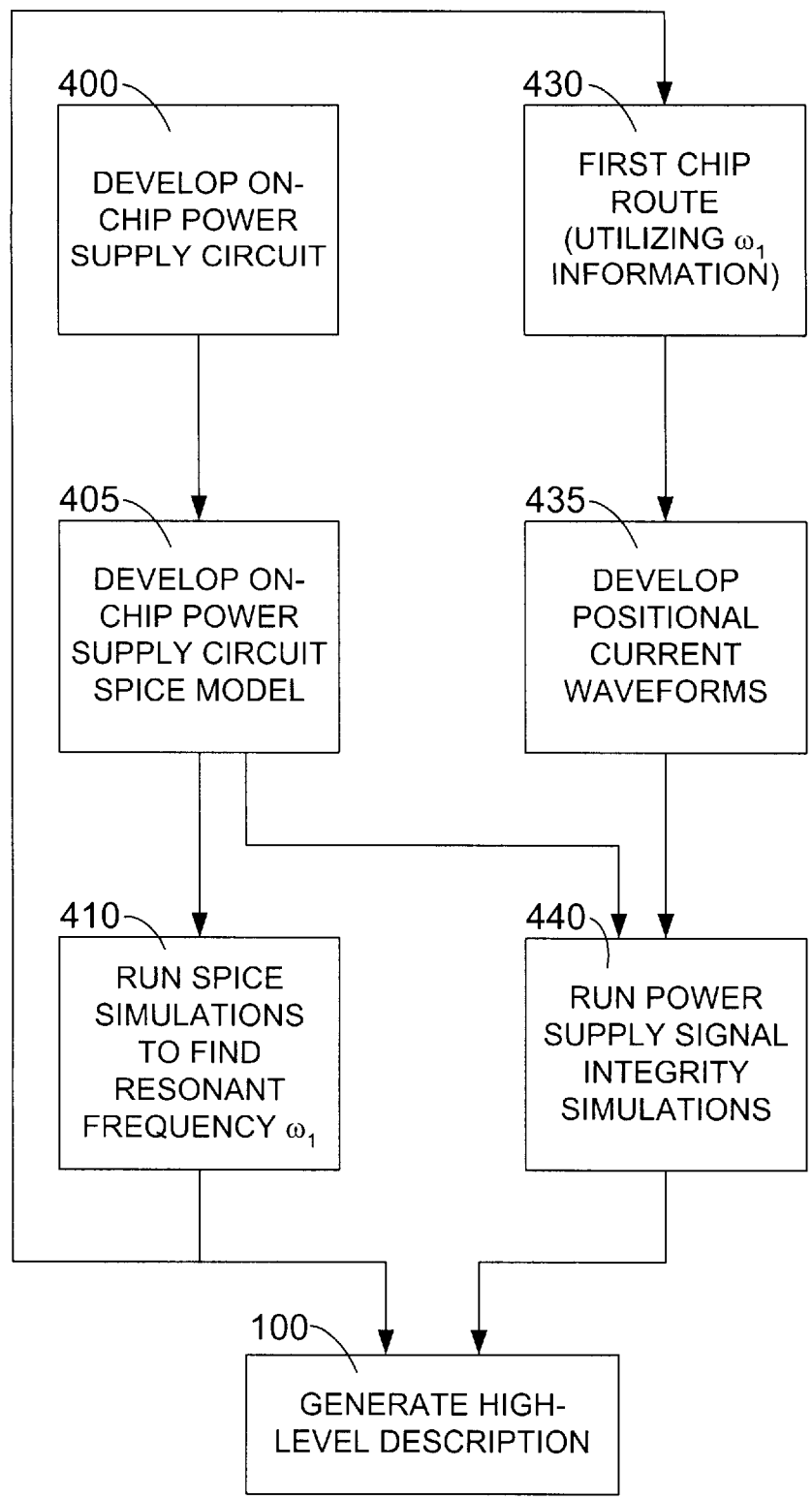
FIG. 7 is a flow chart of a logic synthesis adjustment method according to an embodiment of the invention in which only the on-chip power supply circuit is previously known, and the resulting design constraints are used to manually modify the high-level description of the IC.
Figure 8:
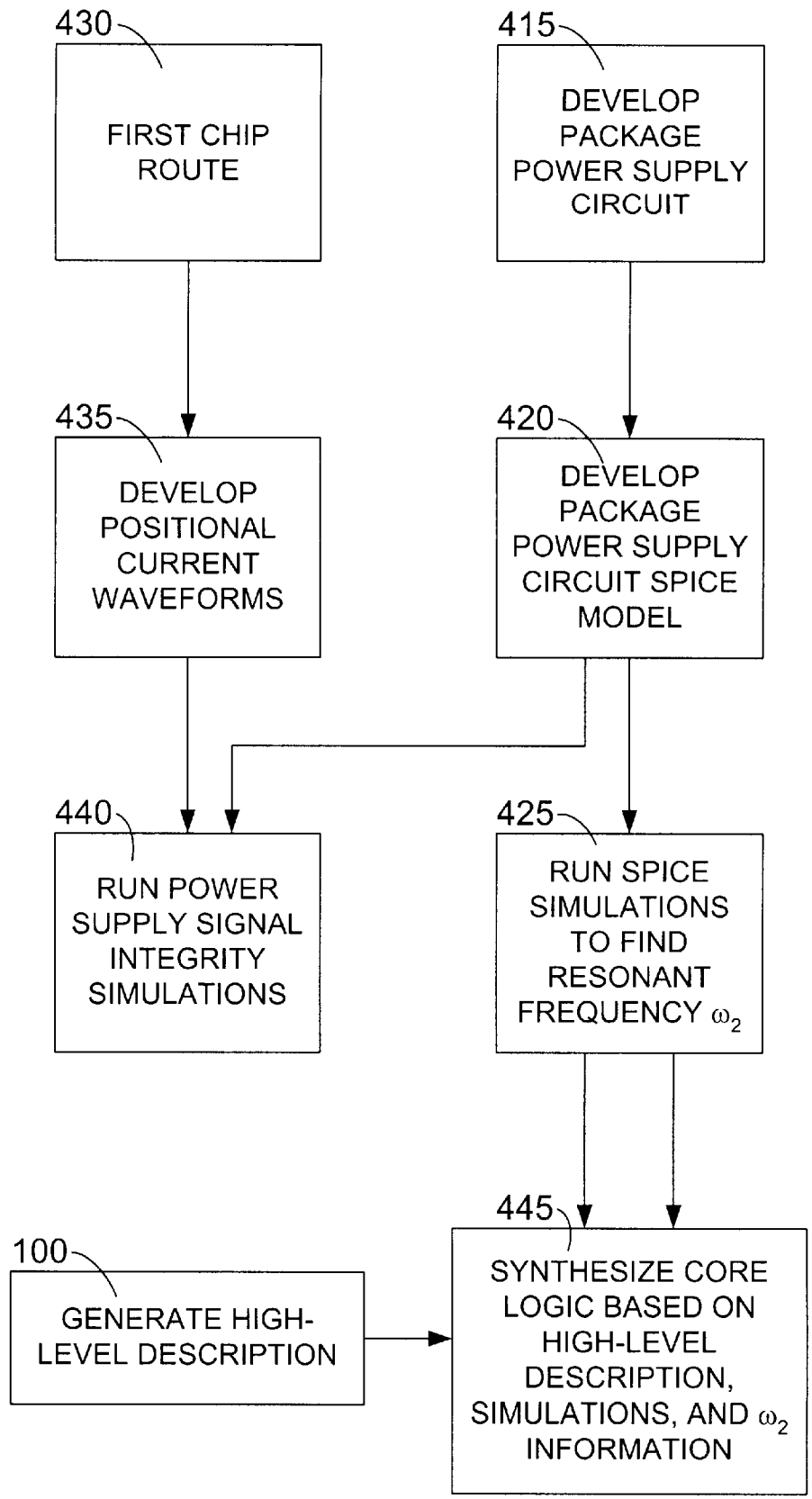
FIG. 8 is a flow chart of a logic synthesis adjustment method according to an embodiment of the invention in which only the package power supply circuit is previously known, and the resulting design constraints are input directly into a logic synthesis tool.
Figure 9:
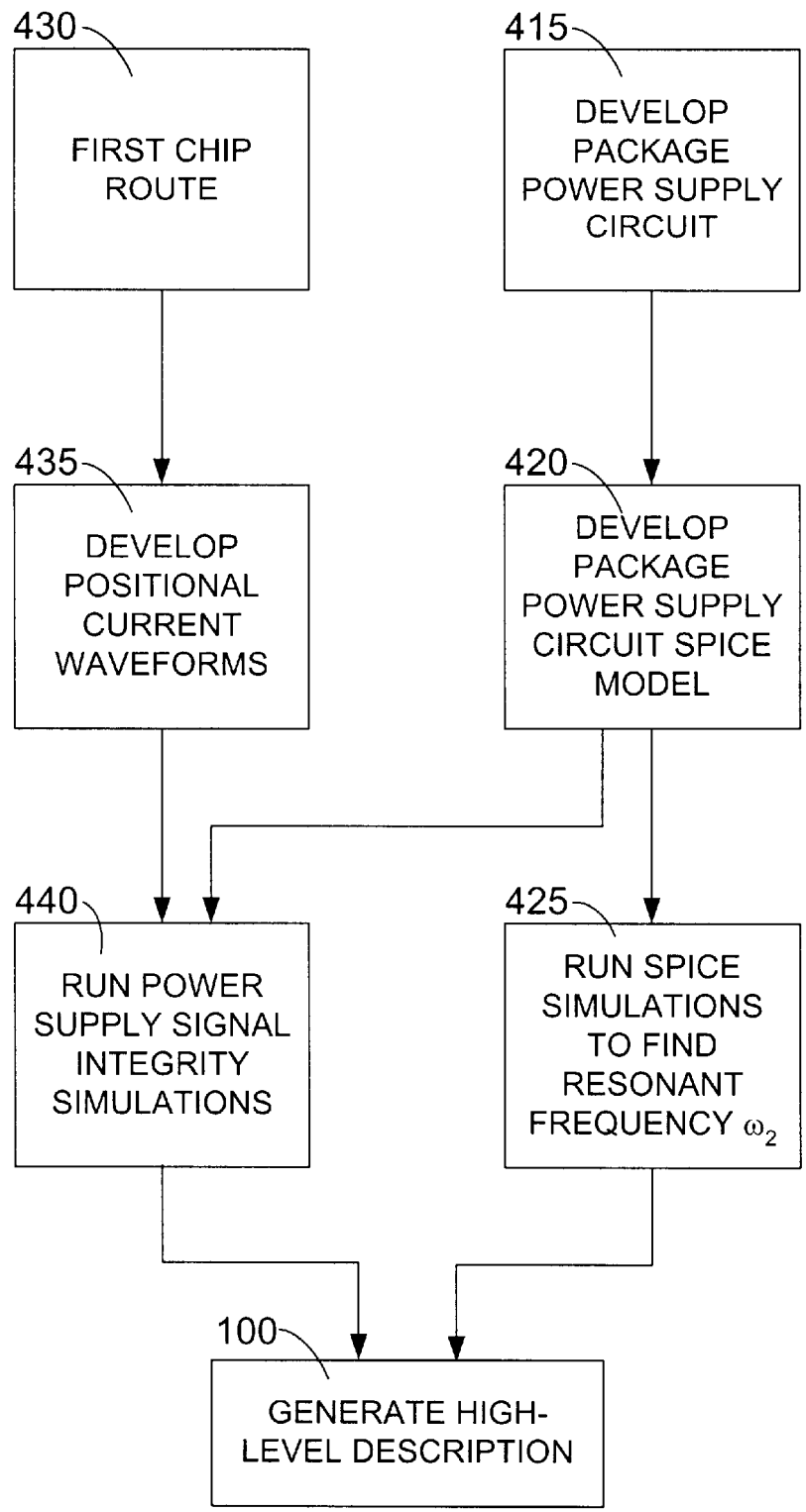
FIG. 9 is a flow chart of a logic synthesis adjustment method according to an embodiment of the invention in which only the package power supply circuit is previously known, and the resulting design constraints are used to manually modify the high-level description of the IC.

In some cases, the IC designer may only know the physical structure of the on-chip power supply circuitry prior to the design and synthesis of the core logic. In that case, the information from the on-chip power supply SPICE model may be used in the absence of the corresponding data for the package power supply to modify the core logic circuitry, as shown in FIG. 6 and FIG. 7. FIG. 6 shows an embodiment whereby the information concerning the on-chip power supply circuitry is input to the logic synthesis tool, which automatically takes that information into account during the synthesis process. FIG. 7, on the other hand, depicts the use of that information by the IC designer to manually adjust the high-level description of the core logic prior to synthesis. Such a method is implemented so that as much as is known about the power supply circuitry is incorporated as early as possible into the design of the core logic circuitry. Similarly, as shown in FIG. 8 and FIG. 9, if only the package power supply circuitry is known prior to the design and synthesis of the core logic, information concerning the package can be used to influence the early portions of the IC design process. FIG. 8 shows the automatic use of the package power supply information within the synthesis tool, while FIG. 9 illustrates the use of that information within the high-level description of the core logic. In general, incorporating any physical information regarding the power supply circuitry into the early stages of the design process is beneficial because of the fewer design and simulation iterations that result later in the design cycle.

Figure 10:
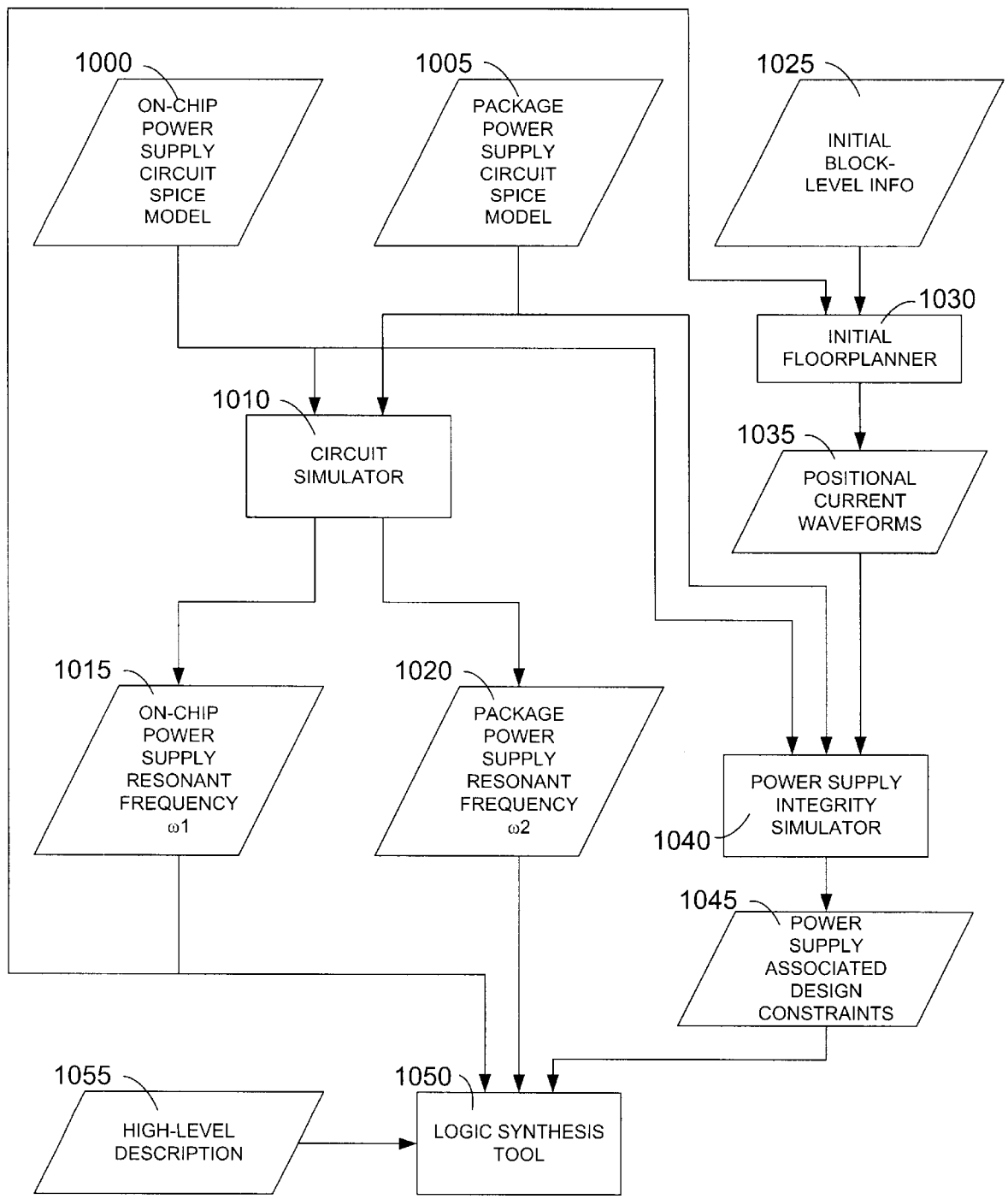
FIG. 10 is a flow chart of a system, with associated input and output data, according to an embodiment of the invention in which both the package and on-chip power supply circuits are previously known, and the resulting design constraints are input directly into a logic synthesis tool.

The invention is also embodied as a system of incorporating the physical information of the package and on-chip power supply circuits into the synthesis of the core logic circuitry of an IC. As shown in FIG. 10, an on-chip power supply SPICE model 1000 and a package power supply SPICE model 1005 are each used as input to a circuit simulator 1010 which identifies the resonant frequencies associated with the on-chip and package power supply circuits (1015 and 1020, respectively). An initial floorplanner 1030 uses initial, block-level information 1025 about the core logic, as well as on-chip power supply circuit resonant frequency 1015, to generate a set of positional current waveforms 1035 that indicate the current load caused by the IC core logic at various locations on the chip. (Of course, initial floorplanner 1030 develops an initial floorplan of the IC core logic, as well, which is not shown in FIG. 10.) A power supply integrity simulator 1040 uses positional current waveforms 1035, on-chip power supply SPICE model 1000, and package power supply SPICE model 1005 to determine any periodic and non-periodic conflicts between the core logic current waveforms and the power supply circuits. As a result of its work, power supply integrity simulator 1040 generates a set of design constraints 1045 associated with the power supply circuits that cause the discovered conflicts to be resolved. A logic synthesis tool 1050 then uses design constraints 1045 and resonant frequencies 1015 and 1020 from circuit simulator 1010 as input to be added to a high-level description 1055 of the core logic. High-level description 1055 may or may not have been simulated at the functional level prior to being passed to logic synthesis tool 1050. The resulting output of logic synthesis tool 1050 is a gate-level description of the IC that exhibits no compatibility problems with the package and on-chip power supply circuits of the IC.

Additional system embodiments of the invention are analogous to the embodiment methods described earlier. For example, it is possible that either (but not both) SPICE model 1000 or 1005 (from FIG. 10) will not be available prior to the design of the core logic. If that is the case, only one SPICE model (1000 or 1005) and one resonant frequency (1015 or 1020) will be available to be used in the remainder of the system. Additionally, design constraints 1045 may be used by the IC designer to manually modify the high-level description 1055 of the core logic. This embodiment is useful in the case that logic synthesizer 1050 does not have the capability to use that information to automatically modify the synthesis process.

From the foregoing, it will be apparent that the invention provides a useful and effective system and method for adjusting the logic synthesis of the core logic of an integrated circuit to account for the physical characteristics of both the on-chip and IC package power supply circuits. Accounting for the interaction between the power supply circuits and the core logic circuit prior to logic synthesis in this manner prevents the late discovery of potential power supply problems that adversely impact the time-to-market of the IC and the functional operation of the IC after being delivered to the customer.

What is claimed is:

1. A method for adjusting the logic synthesis process of an integrated circuit design having a core logic circuit, a package power supply circuit, and an on-chip power supply circuit, to mitigate possible incompatibilities between the core logic circuit and the power supply circuits, the method comprising the steps of:

developing a package power supply circuit model for the package power supply circuit, and an on-chip power supply circuit model for the on-chip power supply circuit;

simulating the operation of the package power supply circuit and the on-chip power supply circuit using the circuit models to identify a package power supply resonant frequency and an on-chip power supply resonant frequency;

generating an initial IC floorplan using a block-level description of the core logic and the on-chip power supply resonant frequency;

producing positional current waveforms based on the initial IC floorplan; and performing a power supply signal integrity simulation using the circuit models and the positional current waveforms to create design constraints that mitigate the possible incompatibilities between the core logic circuit and the power supply circuits.

2. The method of claim 1, further comprising the step of synthesizing a high-level description of the core logic circuit into a gate-level description of the core logic circuit, using the design constraints created by the performing step, and the resonant frequencies identified by the simulating step.

3. The method of claim 1, wherein the design constraints created by the performing step, and the resonant frequencies identified by the simulating step, are of a form usable as input to a logic synthesis tool.

4. The method of claim 1, wherein the design constraints created by the performing step, and the resonant frequencies identified by the simulating step, are of a form usable by an IC designer to manually modify a high-level description of the core logic circuit.

5. A method for adjusting the logic synthesis process of an integrated circuit design having a core logic circuit and an on-chip power supply circuit, to mitigate possible incompatibilities between the core logic circuit and the on-chip power supply circuit, the method comprising the steps of:

developing a circuit model for the on-chip power supply circuit;

simulating the operation of the on-chip power supply circuit using the circuit model to identify an on-chip power supply resonant frequency;

generating an initial IC floorplan using a block-level description of the core logic and the on-chip power supply resonant frequency;

producing positional current waveforms based on the initial IC floorplan; and performing a power supply signal integrity simulation using the circuit model and the positional current waveforms to create design constraints that mitigate the possible incompatibilities between the core logic circuit and the on-chip power supply circuit.

6. The method of claim 5, further comprising the step of synthesizing a high-level description of the core logic circuit into a gate-level description of the core logic circuit, using the design constraints created by the performing step, and the resonant frequency identified by the simulating step.

7. The method of claim 5, wherein the design constraints created by the performing step, and the resonant frequency identified by the simulating step, are of a form usable as input to a logic synthesis tool.

8. The method of claim 5, wherein the design constraints created by the performing step, and the resonant frequency identified by the simulating step, are of a form usable by an IC designer to manually modify a high-level description of the core logic circuit.

9. A method for adjusting the logic synthesis process of an integrated circuit design having a core logic circuit and a package power supply circuit, to mitigate possible incompatibilities between the core logic circuit and the package power supply circuit, the method comprising the steps of:

developing a circuit model for the package power supply circuit;

simulating the operation of the package power supply circuit using the circuit model to identify a package power supply resonant frequency;

generating an initial IC floorplan using a block-level description of the core logic;

producing positional current waveforms based on the initial IC floorplan; and performing a power supply signal integrity simulation using the circuit model and the positional current waveforms to create design constraints that mitigate the possible incompatibilities between the core logic circuit and the package power supply circuit.

10. The method of claim 9, further comprising the step of synthesizing a high-level description of the core logic circuit into a gate-level description of the core logic circuit, using the design constraints created by the performing step, and the resonant frequency identified by the simulating step.

11. The method of claim 9, wherein the design constraints created by the performing step, and the resonant frequency identified by the simulating step, are of a form usable as input to a logic synthesis tool.

12. The method of claim 9, wherein the design constraints created by the performing step, and the resonant frequency identified by the simulating step, are of a form usable by an IC designer to manually modify a high-level description of the core logic circuit.

13. A system for adjusting the logic synthesis process of an integrated circuit design having a core logic circuit, a package power supply circuit, and an on-chip power supply circuit, to mitigate possible incompatibilities between the core logic circuit and the power supply circuits, the system comprising:

a circuit simulator, using a package power supply circuit model and an on-chip power supply circuit model, that identifies a package power supply circuit resonant frequency and an on-chip power supply circuit resonant frequency;

an initial floorplanner that generates positional current waveforms, using a block-level description of the core logic, and using the on-chip power supply circuit resonant frequency to avoid an incompatibility with the on-chip power supply circuit; and a power supply integrity simulator that uses the positional current waveforms, the package power supply circuit model, and the on-chip power supply circuit model to create design constraints that mitigate the possible incompatibilities between the core logic circuit and the power supply circuits.

14. The system of claim 13, further comprising a logic synthesis tool which transforms a high-level description of the core logic circuit into a gate-level description of the core logic circuit, using the design constraints generated by the power supply integrity simulator, and the resonant frequencies identified by the circuit simulator.

15. The system of claim 13, wherein the design constraints created by the power supply integrity simulator, and the resonant frequencies identified by the circuit simulator, are of a form usable as input to a logic synthesis tool.

16. The system of claim 13, wherein the design constraints created by the power supply integrity simulator, and the resonant frequencies identified by the circuit simulator, are of a form usable by an IC designer to manually modify a high-level description of the core logic circuit.

17. A system for adjusting the logic synthesis process of an integrated circuit design having a core logic circuit and an on-chip power supply circuit to mitigate possible incompatibilities between the core logic circuit and the on-chip power supply circuit, the system comprising:

a circuit simulator, using an on-chip power supply circuit model, that identifies an on-chip power supply circuit resonant frequency;

an initial floorplanner that generates positional current waveforms, using a block-level description of the core logic, and using the on-chip power supply circuit resonant frequency to avoid an incompatibility with the on-chip power supply circuit; and a power supply integrity simulator that uses the positional current waveforms and the on-chip power supply circuit model to create design constraints that mitigate the possible incompatibilities between the core logic circuit and the on-chip power supply circuit.

18. The system of claim 17, further comprising a logic synthesis tool which transforms a high-level description of the core logic circuit into a gate-level description of the core logic circuit, using the design constraints generated by the power supply integrity simulator, and the resonant frequency identified by the circuit simulator.

19. The system of claim 17, wherein the design constraints created by the power supply integrity simulator, and the resonant frequency identified by the circuit simulator, are of a form usable as input to a logic synthesis tool.

20. The system of claim 17, wherein the design constraints created by the power supply integrity simulator, and the resonant frequency identified by the circuit simulator, are of a form usable by an IC designer to manually modify a high-level description of the core logic circuit.

21. A system for adjusting the logic synthesis process of an integrated circuit design having a core logic circuit, and a package power supply circuit, to mitigate possible incompatibilities between the core logic circuit and the package power supply circuit, the system comprising:

a circuit simulator, using a package power supply circuit model, that identifies a package power supply circuit resonant frequency;

an initial floorplanner that generates positional current waveforms, using a block-level description of the core logic; and a power supply integrity simulator that uses the positional current waveforms and the package power supply circuit model to create design constraints that mitigate the possible incompatibilities between the core logic circuit and the package power supply circuit.

22. The system of claim 21, further comprising a logic synthesis tool which transforms a high-level description of the core logic circuit into a gate-level description of the core logic circuit, using the design constraints generated by the power supply integrity simulator, and the resonant frequency identified by the circuit simulator.

23. The system of claim 21, wherein the design constraints created by the power supply integrity simulator, and the resonant frequency identified by the circuit simulator, are of a form usable as input to a logic synthesis tool.

24. The system of claim 21, wherein the design constraints created by the power supply integrity simulator, and the resonant frequency identified by the circuit simulator, are of a form usable by an IC designer to manually modify a high-level description of the core logic circuit.

* * * * *